United States Patent
Jeong et al.

(10) Patent No.: US 8,575,644 B2
(45) Date of Patent: Nov. 5, 2013

(54) LIGHT EMITTING DEVICE HAVING AN ELECTRO-STATIC DISCHARGE PROTECTION PART

(75) Inventors: Hwan Hee Jeong, Seoul (KR); Sang Youl Lee, Seoul (KR); Jung Hyeok Bae, Seoul (KR); Kwang Ki Choi, Seoul (KR); June O Song, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 101 days.

(21) Appl. No.: 13/192,142

(22) Filed: Jul. 27, 2011

(65) Prior Publication Data
US 2012/0025249 A1    Feb. 2, 2012

(30) Foreign Application Priority Data
Jul. 28, 2010   (KR) .................. 10-2010-0072805

(51) Int. Cl.
*H01L 33/00*    (2010.01)
(52) U.S. Cl.
USPC ............. 257/99; 257/E33.058; 257/E33.072; 257/98
(58) Field of Classification Search
USPC .................. 257/E33.072, E33.058, 99, 98
See application file for complete search history.

(56) References Cited

U.S. PATENT DOCUMENTS

| | | | | |
|---|---|---|---|---|
| 6,468,821 B2 * | 10/2002 | Maeda et al. | ................... | 438/29 |
| 7,189,952 B2 * | 3/2007 | Guedj et al. | ................ | 250/208.1 |
| 7,483,464 B2 * | 1/2009 | Kuwata et al. | ............... | 372/50.1 |
| 2006/0163604 A1 | 7/2006 | Shin et al. | | |
| 2007/0018177 A1 | 1/2007 | Lee et al. | | |
| 2009/0035925 A1 * | 2/2009 | Zhu et al. | ..................... | 438/534 |
| 2010/0019264 A1 * | 1/2010 | Jeong | .............................. | 257/98 |
| 2010/0171135 A1 * | 7/2010 | Engl et al. | ....................... | 257/98 |
| 2011/0260205 A1 * | 10/2011 | Moosburger et al. | ........... | 257/99 |

FOREIGN PATENT DOCUMENTS

| | | |
|---|---|---|
| EP | 2330638 A1 | 6/2011 |
| JP | 2007-512689 A | 9/2001 |
| KR | 2001-0088929 A | 9/2001 |
| KR | 10-2010-0011116 A | 2/2010 |
| KR | 10-2010-0067441 A | 6/2010 |
| KR | 10-2010-0077909 A | 7/2010 |
| KR | 10-2010-0078521 A | 7/2010 |
| WO | WO 2005/124880 A1 | 12/2005 |
| WO | WO2010060404 * | 6/2010 |

* cited by examiner

*Primary Examiner* — Kimberly Rizkallah
*Assistant Examiner* — Alexander Belousov
(74) *Attorney, Agent, or Firm* — Birch, Stewart, Kolasch & Birch, LLP

(57) ABSTRACT

Provided are a light emitting device and a light emitting device package. According to the light emitting device, a light emitting part and an electro-static discharge (ESD) protection part are disposed on a conductive support member. A connection layer electrically connects a first conducitve type semiconductor layer of the light emitting part to a second conductive type semiconductor layer of the ESD protection part. A ptrtection member is disposed on the connection layer and the ESD protection layer.

20 Claims, 12 Drawing Sheets

LIGHT EMITTING DEVICE HAVING AN ELECTRO-STATIC DISCHARGE PROTECTION PART

CROSS-REFERENCE TO RELATED APPLICATIONS

The present application claims priority under 35 U.S.C. § 119(a) of Korean Patent Application No. 10-2010-0072805 filed on Jul. 28, 2010, which is hereby incorporated by reference in its entirety.

BACKGROUND

Embodiments relates to a light emitting device and a light emitting device package.

A light emitting diode (LED) is a kind of semiconductor device for converting electrical energy into light. The LED has advantages such as low power consumption, a semi-permanent life cycle, a fast response time, safety, and environment friendly compared to the related art light source such as a fluorescent lamp and an incandescent bulb. Many studies are being in progress in order to replace the related art light source with an LED. Also, the LED is being increasingly used according to the trend as light sources of a lighting device such as a variety of lamps and streetlights, a lighting unit of a liquid crystal display device, and a scoreboard in indoor and outdoor places.

SUMMARY

Embodiments provide a light emitting device having a new structure and a light emitting device package.

Embodiments also provide a light emitting device which is protected against static electricity and a light emitting device package.

In one embodiment, a light emitting device includes: a conductive support member; a light emitting part including a first conductive type semiconductor layer, an active layer, and a second conductive type semiconductor layer on the conductive support member, wherein the second conductive type semiconductor layer is electrically connected to the conductive support member; an electro-static discharge (ESD) protection part including a first conductive type semiconductor layer, an active layer, and a second conductive type semiconductor layer on the conductive support member; a first connection layer electrically connecting the first conductive type semiconductor layer of the light emitting part to the second conductive type semiconductor layer of the ESD protection part; and a protection member on the ESD protection part and the first connection layer.

In another embodiment, a light emitting device includes: a conductive support member; a light emitting part including a first structure layer; an electro-static discharge (ESD) protection part including a second structure layer, wherein the first and second structure layers include a first conductive type semiconductor layer on the conductive support member, an active layer on the first conductive type semiconductor layer, and a second conductive type semiconductor layer on the active layer; first and second recesses passing through the first conductive type semiconductor layer and the active layer to expose a Ga-face region of the second conductive type semiconductor layer; first and second protection layers around side surfaces of the first and second recesses, respectively; a first connection layer connecting the Ga-face region of the second conductive type semiconductor layer to the first conductive type semiconductor layer of the ESD protection part through the first protection layer; and a protection member on the first connection layer and the first conductive type semiconductor layer of the ESD protection part.

In further another embodiment, a light emitting device package includes: a body; a light emitting device on the body; and a molding member surrounding the light emitting device, wherein the light emitting device includes: a conductive support member; a light emitting part including a first conductive type semiconductor layer, an active layer, and a second conductive type semiconductor layer on the conductive support member, wherein the second conductive type semiconductor layer is electrically connected to the conductive support member; an electro-static discharge (ESD) protection part including a first conductive type semiconductor layer, an active layer, and a second conductive type semiconductor layer on the conductive support member; a first connection layer electrically connecting the first conductive type semiconductor layer of the light emitting part to the second conductive type semiconductor layer of the ESD protection part; a second connection layer electrically connecting the second conductive type semiconductor layer of the light emitting part to the first conductive type semiconductor layer of the ESD protection part; and a protection member on the ESD protection part and the first connection layer.

The details of one or more embodiments are set forth in the accompanying drawings and the description below. Other features will be apparent from the description and drawings, and from the claims.

DETAILED DESCRIPTION OF THE EMBODIMENTS

Figure 1:
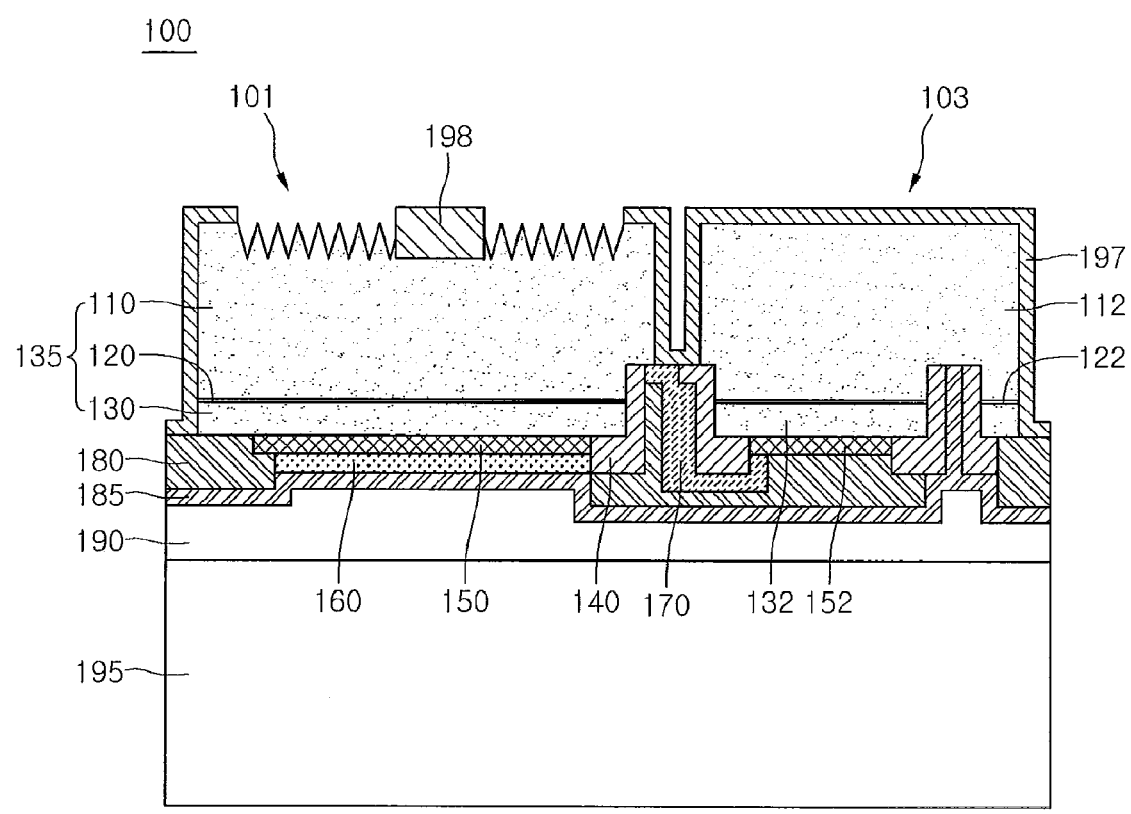
FIG. 1 is a side-sectional view of a light emitting device according to an embodiment.

In the descriptions of embodiments, it will be understood that when a layer (or film), a region, a pattern, or a structure is referred to as being 'on' a substrate, a layer (or film), a region, a pad, or patterns, it can be directly on another layer or substrate, or intervening layers may also be present. Further, it will be understood that when a layer is referred to as being 'under' another layer, it can be directly under another layer, and one or more intervening layers may also be present. Further, the reference about 'on' and 'under' each layer will be made on the basis of drawings.

Hereinafter, embodiments will be described with reference to the accompanying drawings. In the drawings, the thickness or size of each layer is exaggerated, omitted, or schematically illustrated for convenience in description and clarity. Also, the size of each element does not entirely reflect an actual size.

FIG. 1 is a side-sectional view of a light emitting device according to an embodiment.

Referring to FIG. 1, a light emitting device 100 includes a light emitting part 101, an electro-static discharge (ESD) protection part 103, an adhesion layer 190 supporting the light emitting device 101 and the ESD protection part 103, and a conductive support member 195.

The light emitting part 101 includes a first conductive type semiconductor layer 110, an active layer 120, a second conductive type semiconductor layer 130, a first ohmic contact layer 150, and an electrode 198. The ESD protection part 103 includes a first conductive type semiconductor layer 112, an active layer 122, a second conductive type semiconductor layer 132, and a second ohmic contact layer 152.

A first protection layer 140 is disposed on an inner surface of a light emitting structure layer 135 to electrically separate the light emitting part 101 from the ESD protection part 103. The first protection layer 140 may be formed of at least one of $SiO_2$, $Si_3N_4$, $Al_2O_3$, and $TiO_2$.

The first ohmic contact layer 150 is disposed in an inner region above the second conductive type semiconductor layer 130, and the second ohmic contact layer 152 is disposed in an inner region above the second conductive type semiconductor layer 132.

A reflective layer 160 may be disposed on the first ohmic contact layer 150. The reflective layer 160 may reflect light incident from the light emitting structure layer 135 to improve light emitting efficiency of the light emitting device 100.

A first connection layer 170 is disposed in an inner region. A first end of the first connection layer 170 is connected to the first conductive type semiconductor layer 110 and a second end of the first connection layer 170 is connected to the second ohmic contact layer 152. The first end of the first connection layer 170 may be connected to a Ga-face region of the first conductive type semiconductor layer 110.

The Ga-face region and an N-face region will be described below.

Figure 2:
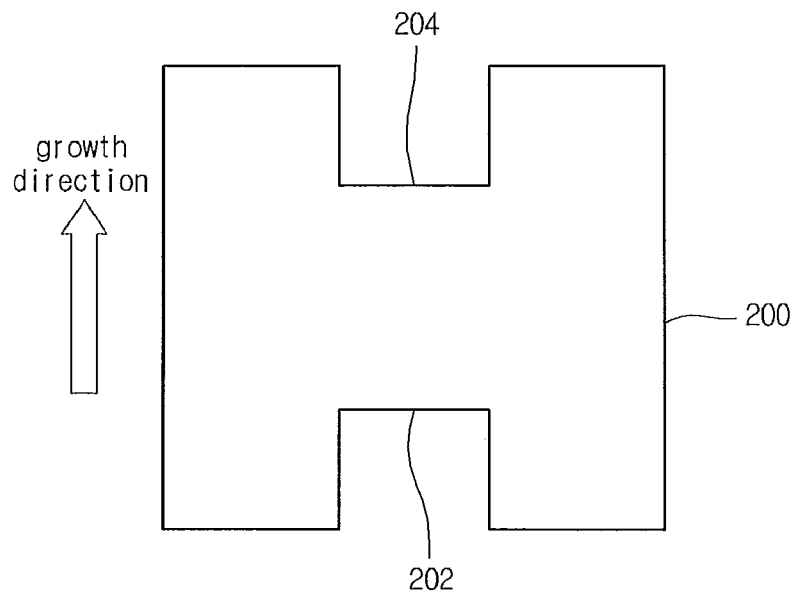
FIG. 2 is a view of an N-face region and a Ga-face region.

Referring to FIG. 2, a Ga material and an N material may be mixed with each other and then grown in an upward direction to form a GaN layer 200. Here, an In material or an Al material may be further added.

A bottom or top surface of the grown GaN layer 200 may be etched.

That is, the GaN layer 200 may be etched upwardly from the bottom surface thereof. A surface of the GaN layer 200 exposed by the above-described etching process may become an N-face region 202.

Also, the GaN layer 200 may be etched downwardly from the top surface thereof. A surface of the GaN layer 200 exposed by the above-described etching process may become a Ga-face region 204.

Thermal stability and operation voltage characteristic in the N-face region 202 and the Ga-face region 204 are different from each other.

Typically, a crystalization in the Ga-face region 204 is superior to that in the N-face region 202. Thus, the thermal stability in the Ga-face region 204 is superior to that in the N-face region 202.

Furthermore, the operation voltage characteristic in the Ga-face region 204 is superior to that in the N-face region 202.

Figure 3:
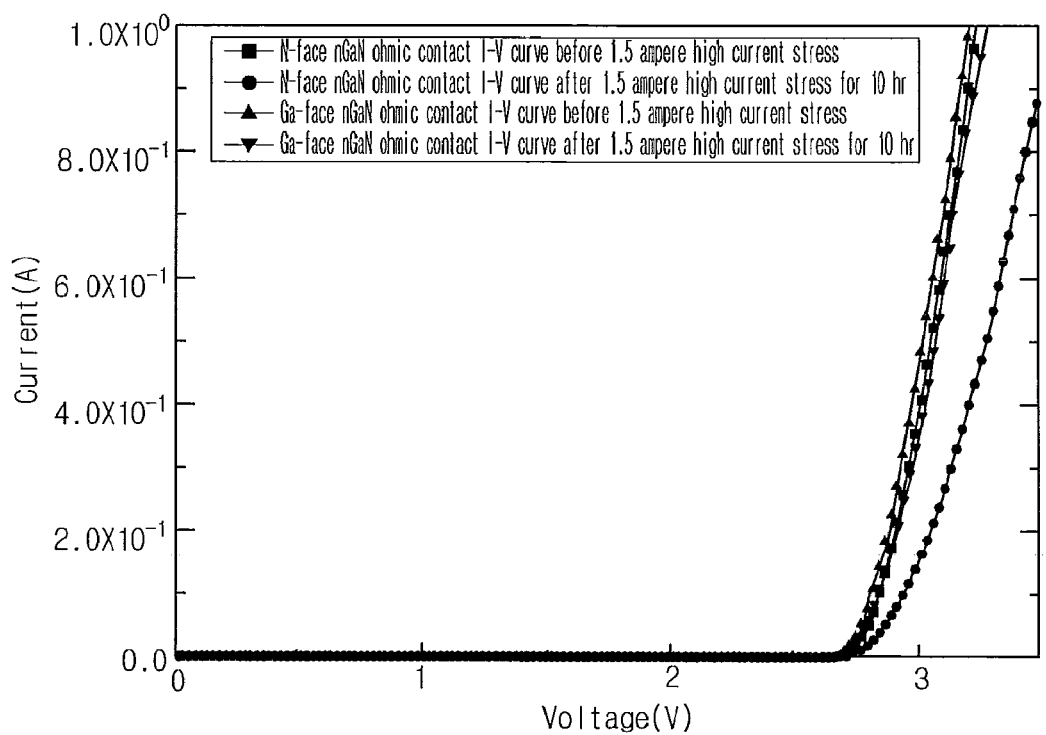
FIG. 3 is a graph of operation voltage characteristics in the N-face region and the Ga-face region.

Referring to FIG. 3, when the light emitting device is operated for a long time, e.g., ten hours, the operation voltage characteristic in the Ga-face region 204 keep unchanged. However, the operation voltage characteristic in the N-face region 202 is reduced.

Thus, when an electrical contact occurs in the Ga-face region 204, a light emitting device having superior operation voltage characteristics may be obtained.

According to an embodiment, since the first end of the first connection layer 170 is connected to the Ga-face region of the first conductive type semiconductor layer 110 of the light emitting part 101, a light emitting device having superior operation voltage characteristics may be obtained.

A protection member 180 may be disposed in outer regions of the second conductive type semiconductor layers 130 and 132 and on the first protection layer 140, the first connection layer 170, and the second ohmic contact layer 152. The first protection layer 140 surrounds each of the first and second connection layers 170 and 185 to prevent the first conductive type semiconductor layers 110 and 112 and the second conductive type semiconductor layers 130 and 132 from being be shorted.

The protection member 180 may prevent moisture from being permeated into a gap between the light emitting structure layer 135 and the conductive support member 195 and also may electrically insulate the light emitting part 101 from the ESD protection part 103. In addition, the protection member 180 completely covers the first connection layer 170 to prevent the electrical connection of the first connection layer to any other elements. Furthermore, the protection member 180 is disposed on the first connection layer 170 and the ESD protection part 103.

A second connection layer 185 is disposed on top surfaces of the protection member 180 and the reflective layer 160 and top and side surfaces of the first protection layer 140.

The second connection layer 185 electrically connects the second conductive type semiconductor layer 130 of the light emitting part 101 to the first conductive type semiconductor layer 112 of the ESD protection part 103.

The light emitting part 101 and the ESD protection part 103 are connected to each other in parallel by the first and second connection layers 170 and 185.

The adhesion layer 190 may serve as a bonding layer. The adhesion layer 190 may be disposed on the second connection layer 185 to enhance an adhesion force with the conductive support member 195.

The conductive support member 195 may be disposed on the adhesion layer 190. The conductive support member 195 may support the light emitting structure layer 135 to provide a power into the light emitting structure layer 135 together with the electrode 198. For example, the conductive support member 195 may be formed of at least one of copper (Cu), gold (An), nickel (Ni), molybdenum (Mo), copper-tungsten (Cu—W), and carrier wafers (e.g., Si, Ge, GaAs, ZnO, Sic, etc). The conductive support member 195 may have a thickness varied according to a design of the light emitting device 100. For example, the conductive support member 195 may have a thickness of about 30 μm to about 500 μm.

As described above, when a forward bias is supplied through the electrode 198 and the conductive support member 195, the semiconductor light emitting device 100 is operated in an LED region. Also, when a voltage such as an ESD is applied, the ESD protection part 103 may protect the light emitting part 101. Here, the ESD protection part 103 may have a size less than about 50% of that of the light emitting part 101 to secure an area of the active layer 120. That is, the ESD protection part 103 may have a size of about 10% to about 20% of that of the light emitting part 101.

As described above, since the crystalization and the thermal stability in the Ga-face region of the second conductive type semiconductor layer 130 of the light emitting part 101 is relatively superior to those in the N-face region of the first conductive type semiconductor layer 110, the Ga-face region of the second conductive type semiconductor layer 130 may be electrically connected to the second conductive type semiconductor layer 122 of the ESD protection part 103 through the first connection layer 170. Also, the second semiconductor layer 130 of the light emitting part 101 may be electrically connected to the first conductive type semiconductor layer 112 of the ESD protection part 103 through the second connection layer 185. Thus, since the ESD surely passes through the ESD protection part 103, it may prevent the light emitting part 101 from being damaged by the ESD to improve reliability of the light emitting device 100.

FIGS. 4 to 16 are views illustrating a process of manufacturing the light emitting device according to an embodiment.

Figure 4:
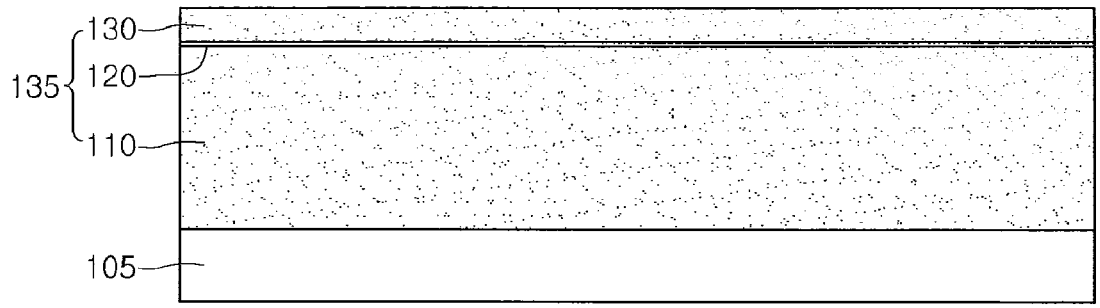
FIGS. 4 to 16 are views illustrating a process of manufacturing the light emitting device according to an embodiment.

Referring to FIG. 4, a light emitting structure layer 135 may be formed on a growth substrate 105.

For example, the growth substrate 105 may be formed of at least one selected from the group consisting of sapphire ($Al_2O$), SiC, GaAs, GaN, ZnO, Si, GaP, InP, and Ge, but is not limited thereto.

The light emitting structure layer 135 may be formed by successively growing a first conductive type semiconductor layer 110, an active layer 120, and a second conductive type semiconductor layer 130 on the growth substrate 105.

For example, the light emitting structure layer 135 may be formed using one of a metal organic chemical vapor deposition (MOCVD) process, a chemical vapor deposition (CVD) process, a plasma-enhanced chemical vapor deposition (PECVD) process, a molecular beam epitaxy (MBE) process, and a hydride vapor phase epitaxy (HVPE) process, but is not limited thereto.

A buffer layer (not shown) for reducing a lattice constant between the light emitting structure layer 135 and the growth substrate 105 may be formed therebetween.

The first conductive type semiconductor layer 110 may be formed of a group III-V compound semiconductor in which a first conductive type dopant is doped, i.e., a semiconductor material having a compositional formula of $In_xAl_yGa_{1-x-y}N$ ($0 \leq x \leq 1$, $0 \leq y \leq 1$, $0 \leq x+y \leq 1$). For example, the first conductive type semiconductor layer 110 may be formed of at least one selected from the group consisting of GaN, AlN, AlGaN, InGaN, InN, InAlGaN, AlInN, AlGaAs, GaP, GaAs, GaAsP, and AlGaInP. When the first conductive type semiconductor layer 110 is an N-type semiconductor layer, the first conductive type dopant may include N-type dopants such as Si, Ge, Sn, Se, and Te. The second conductive type semiconductor layer 110 may be formed as a single layer or a multi layer, but is not limited thereto.

The first conductive type semiconductor layer 110 may be formed by an organic metal chemical deposition process. Here, a Ga material and an N material may be injected onto the growth substrate 105 heated within a chamber to grow the Ga and N materials upward from the growth substrate 105. In this case, an N-face region in which the N material has a relatively high concentration may be defined in a region adjacent to the growth substrate 105 within the first conductive type semiconductor layer 110. Also, a Ga-face region in which the Ga material has a relatively high concentration may be defined in a region adjacent to the active layer 120. Since a crystalization in the Ga-face region is superior to that in the N-face region, thermal stability in the Ga-face region is superior to that in the N-face region.

The active layer 120 may be formed on the first conductive type semiconductor layer 110. In addition, the active layer 120 may have one of a single quantum well structure, a multi quantum well (MQW) structure, a quantum dot structure, and a quantum wire structure. The active layer 120 may have a cycle of a well layer and a barrier layer, e.g., an InGaN well layer/GaN barrier layer or an InGaN well layer/AlGaN barrier layer using the group III-V compound semiconductor material.

A conductive type clad layer (not shown) may be formed above or/and under the active layer 120. The conductive type clad layer may be formed of an AlGaN-based semiconductor.

The second conductive type semiconductor layer 130 may be formed on the active layer 120. The second conductive type semiconductor layer 130 may be formed of a group III-V compound semiconductor in which a second conductive type dopant is doped, i.e., a semiconductor material having a compositional formula of $In_xAl_yGa_{1-x-y}N$ ($0 \leq x \leq 120$, $0 \leq y \leq 2$, $0 \leq x+y \leq 1$). For example, the first conductive type semiconductor layer 110 may be formed of at least one selected from the group consisting of GaN, AlN, AlGaN, InGaN, InN, InAlGaN, AlInN, AlGaAs, GaP, GaAs, GaAsP, and AlGaInP. When the second conductive type semiconductor layer 130 is a P-type semiconductor layer, the second conductive type dopant may include P-type dopants such as Mg, Be, and Zn.

A third conductive type semiconductor layer (not shown) may be formed on the second conductive type semiconductor layer 130. Also, the first conductive type semiconductor layer 110 may be realized as the P-type semiconductor layer, and the second conductive type semiconductor layer 130 may be realizes as the N-type semiconductor layer. Here, when the second conductive type semiconductor layer is the N-type semiconductor layer, the third conductive type semiconductor layer may be realized as the P-type semiconductor layer. On the other hand, when the second conductive type semiconductor layer is the P-type semiconductor layer, the third conductive type semiconductor layer may be realized as the N-type semiconductor layer. The light emitting part 101 may have at least one of an n-p junction structure, a pn junction structure, an n-p-n junction structure, and a p-n-p junction structure.

Figure 5:
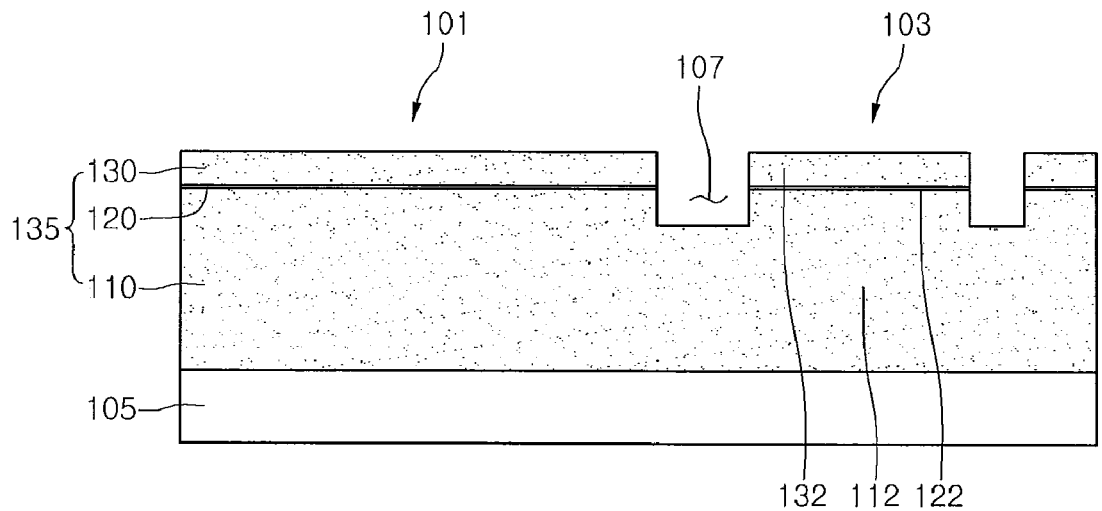

Referring to FIG. 5, a portion of the light emitting structure layer 135 may be etched to form a recess 107 in a plurality of regions so that the Ga-face region of the first conductive type semiconductor layer 110 is exposed. That is, an etched surface of the first conductive type semiconductor layer 110 exposed by the recess 107 may be defined as the Ga-face region. The light emitting part 101 and the ESD protection part 103 are separated from each other by the recess 107. That is, the light emitting structure layer 135 may be divided into the light emitting part 101 including the first conductive type semiconductor layer 110, the active layer 120, and the second conductive type semiconductor layer 130 and the ESD protection part 103 including the first conductive type semiconductor layer 112, the active layer 122, and the second conductive type semiconductor layer 132.

Although a side surface of the light emitting structure layer 125 having the recess 107 is vertically formed with respect to a top surface of the light emitting structure layer 125 in FIG. 5, the recess 107 may have a width gradually increasing or decreasing from the second conductive type semiconductor layer 130 toward the first conductive type semiconductor layer 110, i.e., a width having a trapezoid shape. For example, the recess 107 may be formed so that a portion at which the first conductive type semiconductor layer 110 is disposed has a width less than that of a portion at which the second conductive type semiconductor layer 130 is disposed.

The recess 107 may be formed by an etching process including a wet etching process and a dry etching process or a laser process, but is not limited thereto. Also, the light emitting structure layer 135 having the recess 107 through the etching process or the laser process may have a side surface perpendicular or inclined with respect to a bottom surface of the recess 107. Also, the side surface of the light emitting structure layer 135 may be perpendicular or inclined with respect to a top surface of the light emitting structure layer 135.

Figure 6:
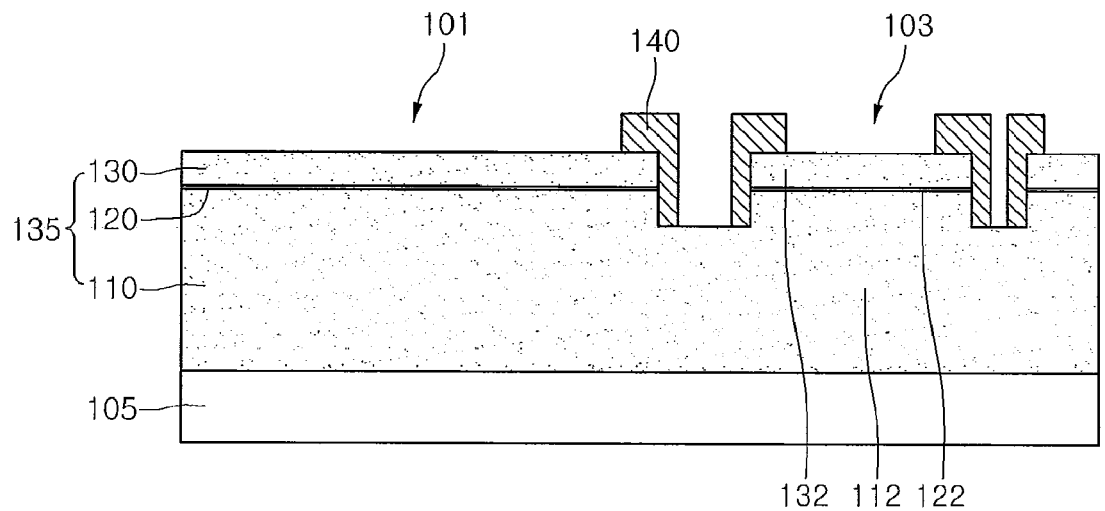
Figure 7:
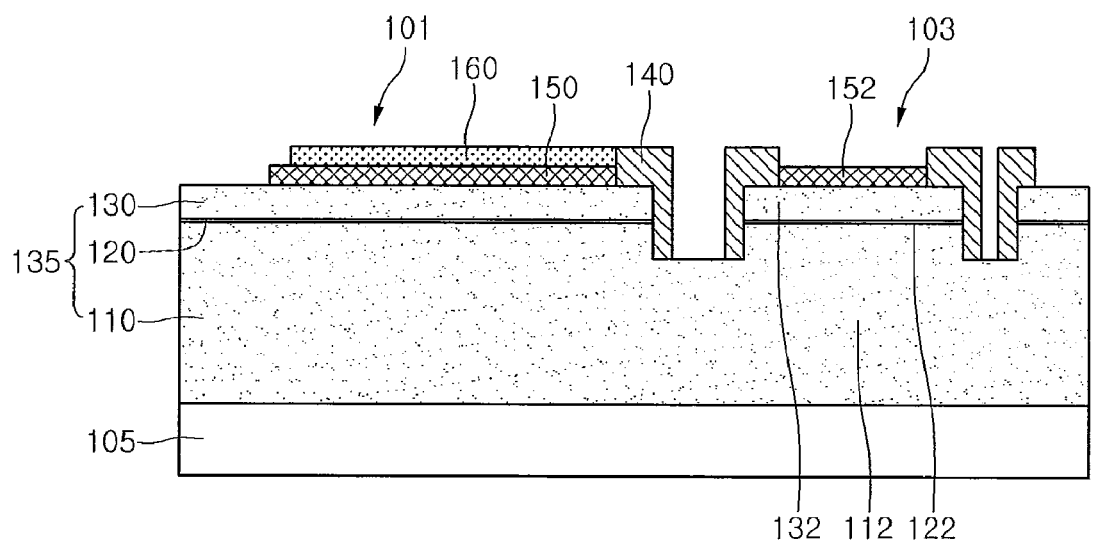

Referring to FIG. 6, a first protection layer 140 is formed on an inner surface of the light emitting structure layer 135 having the recess 107. The first protection layer 140 may be formed of at least one of insulation materials such as $SiO_2$, $Si_3N_4$, $Al_2O_3$, and $TiO_2$ to prevent the light emitting structure layer 135 from being electrically short-circuited.

Referring to FIG. 5, first and second ohmic contact layers 150 and 152 are formed on the second conductive type semiconductor layer 130 of the light emitting part 101 and the second conductive type semiconductor layer 132 of the ESD protection part 103, respectively.

The first and second ohmic contact layer 150 and 152 may respectively ohmic-contact the second conductive type semiconductor layers 130 and 132 to smoothly supply a power into the light emitting structure layer 135. For example, a light-transmitting conductive layer and a metal may be selectively used as the ohmic contact layers 150 and 152. That is, each of the ohmic contact layers 150 and 152 may be realized as a single or multi layer by using at least one selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $IrO_x$, $RuO_x$, $RuO_x$/ITO, Ni, Ag, Pt, Ni/$IrO_x$/Au, and Ni/$IrO_x$/Au/ITO.

A current blocking layer (CBL) (not shown) may be formed within the first ohmic contact layer 150 of the light emitting part 101 to contact the second conductive type semiconductor layer 130. The CBL may partially overlap the electrode 198 in a vertical direction. Thus, a phenomenon in which a current is concentrated into the shortest distance between the electrode 198 and a conductive support member 196 that will be described later may be reduced to improve light emitting efficiency of the light emitting device 100.

For example, the CBL may be formed of at least one of an insulating material, a material having conductivity less than that of the reflective layer 160 or the adhesion layer 190, and a material schottky-contacting the second conductive type semiconductor layer 130. For example, the CBL may be formed of at least one selected from the group consisting of ITO, IZO, IZTO, IAZO, IGZO, IGTO, AZO, ATO, ZnO, SiO2, $SiO_x$, $SiO_xN_y$, $Si_3N_4$, $Al_2O_3$, $TiO_x$, Ti, Al, and Cr.

The CBL may be formed between the first ohmic contact layer 150 and the second conductive type semiconductor layer 130 or between the reflective layer 160 and the first ohmic contact layer 150, but is not limited thereto.

Next, the reflective layer 160 may be formed on the first ohmic contact layer 150 to reflect light incident from the light emitting structure layer 135. For example, the reflective layer 160 may be formed of a metal or alloy including at least one selected from the group consisting of Ag, Ni, Al, Rh, Pd, Ir, Ru, Mg, Zn, Pt, Au and Hf. Alternatively, the reflective layer 160 may be formed as a multi layer using the metal or alloy and a light-transmitting conductive material such as IZO, IZTO, IAZO, IGZO, IGTO, AZO, or ATO. For example, the reflective layer 160 may be formed in a stacked structure such as IZO/Ni, AZO/Ag, IZO/Ag/Ni, AZO/Ag/Ni.

Figure 8:
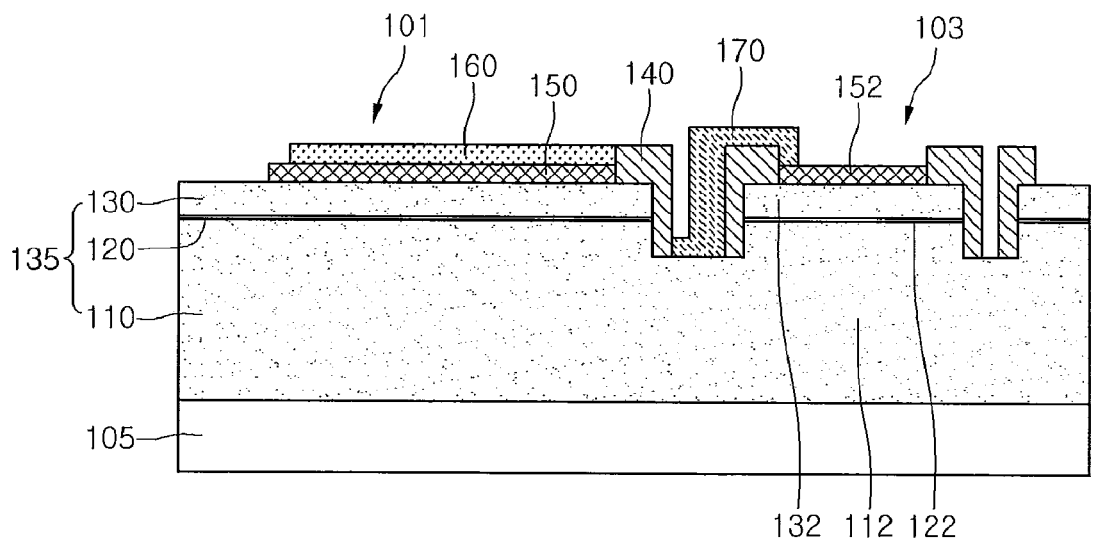

Referring to FIG. 8, a first connection layer 170 electrically connecting the first conductive type semiconductor layer 110 of the light emitting part 101 to the second conductive type semiconductor layer 130 of the ESD protection part 103 may be formed. An end of the first connection layer 170 may be connected to the Ga-face region of the first conductive type semiconductor layer 110 of the light emitting part 101 exposed by the recess 107.

For example, the first connection layer 170 may be formed of a conductive metal material having superior conductivity, e.g., at least one selected from the group consisting of Ti, Ni, Cr, Au, and Cu, but is not limited thereto.

For example, the first connection layer 170 may be formed using one of an E-beam deposition process, a sputtering process, and a plasma enhanced chemical vapor deposition (PECVD) process. Here, since the first connection layer 170 is formed before the growth substrate 105 is removed by a laser lift off process, the process of forming the first connection layer 170 may be easily and stably performed.

Figure 9:
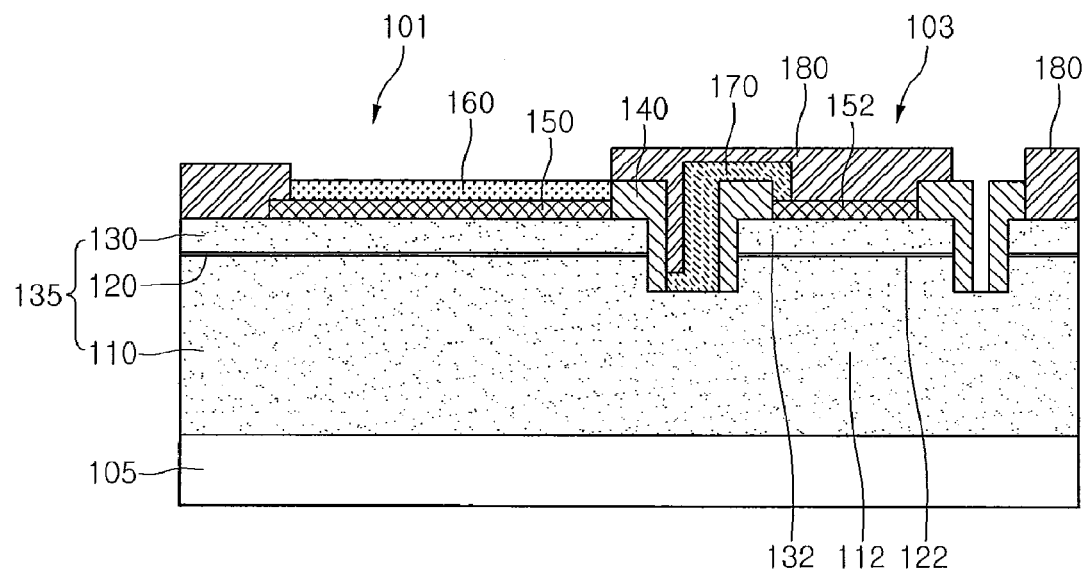

Referring to FIG. 9, a protection member 180 may be formed in outer regions of the second conductive type semiconductor layer 130 of the light emitting part 101 and the second conductive type semiconductor layer 132 of the ESD protection layer 103 and on the first protection layer 140 and the first connection layer 170. The protection member 180 may protect the light emitting device 100 against the outside and electrically insulate the light emitting part 101 from the ESD protection part 103.

For example, the protection member 180 may be formed of at least one of an insulating material, a material having conductivity less than that of the reflective layer 160 or the adhesion layer 190, and a material schottky-contacting the second conductive type semiconductor layer 130. For example, the protection member 180 may be formed of at least one selected from the group consisting of ITO, IZO, IZTO, IAZO, IGZO, IGTO, AZO, ATO, ZnO, $SiO_2$, $SiO_x$, $SiO_xN_y$, $Si_3N_4$, $Al_2O_3$, $TiO_x$, Ti, Al, and Cr.

Figure 10:
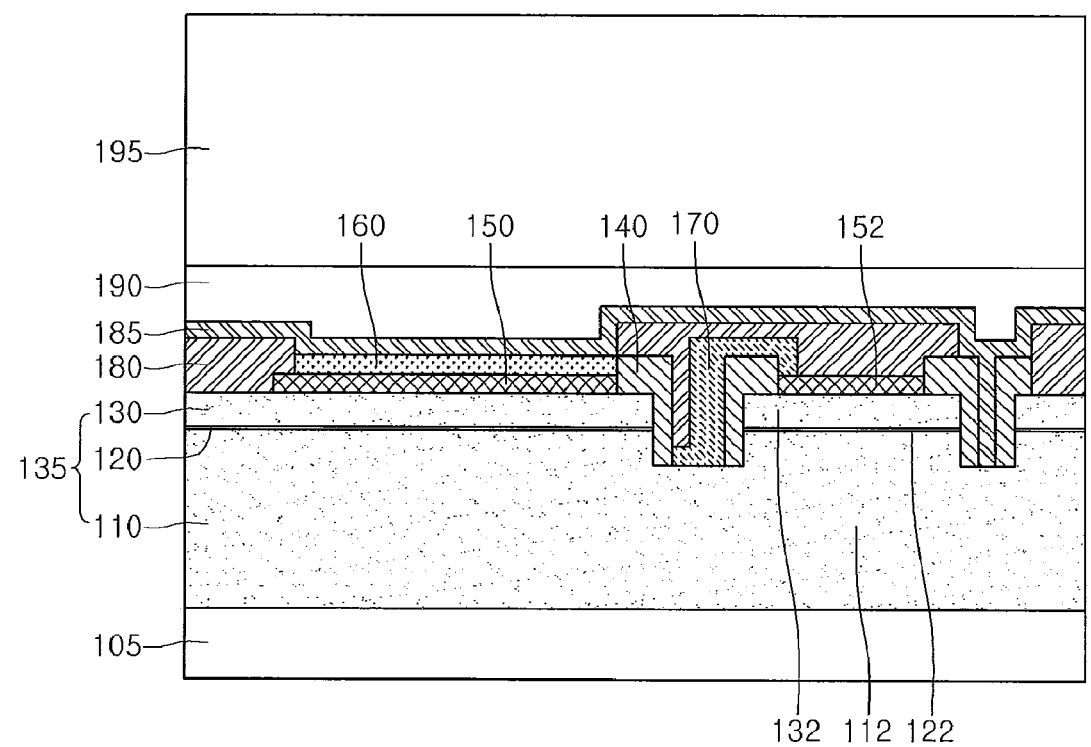

Referring to FIG. 10, a second connection layer 185 electrically connecting the second conductive type semiconductor layer 130 of the light emitting part 101 to the first conductive type semiconductor layer 112 of the ESD protection part 103 may be formed. Although the second connection layer 185 is formed on the reflective layer 160 and the protection member 180 formed within the light emitting device 100 to fill the recess 107 formed in a side of the ESD protection part 103 in the current embodiment, the present disclosure is not limited thereto. For example, the recess 107 formed in a side of the ESD protection part 103 is filled using a mask to form the second connection layer 185 having a pillar shape, thereby connecting the first conductive type semiconductor layer 112 of the ESD protection part 103 to an adhesion layer 190.

For example, the second connection layer 185 may be formed of at least one selected from the group consisting of Ti, Ni, W, WTi, Mo, and Pt.

The light emitting part 101 and the ESD protection part 103 are connected to each other in parallel by the first and second connection layers 170 and 185.

Next, the adhesion layer 190 may be formed on the second connection layer 185. The adhesion layer 190 may enhance an adhesion force with a conductive support member 195 that will be described later. For example, the adhesion layer 190 may be formed of a barrier metal or bonding metal, e.g., at least one selected from the group consisting of Ti, Au, Sn, Ni, Cr, Ga, In, Bi, Cu, Ag, and Ta.

Next, the conductive support member 195 may be formed on the adhesion layer 190. The conductive support member 195 may support the light emitting structure layer 135 to provide a power into the light emitting structure layer 135 together with an electrode 198 that will be described later. For example, the conductive support member 195 may be formed of at least one selected from the group consisting of copper (Cu), gold (Au), nickel (Ni), molybdenum (Mo), copper-tungsten (Cu—W), AlSi, and carrier wafers (e.g., Si, Ge, GaAs, ZnO, Sic, etc).

Figure 11:
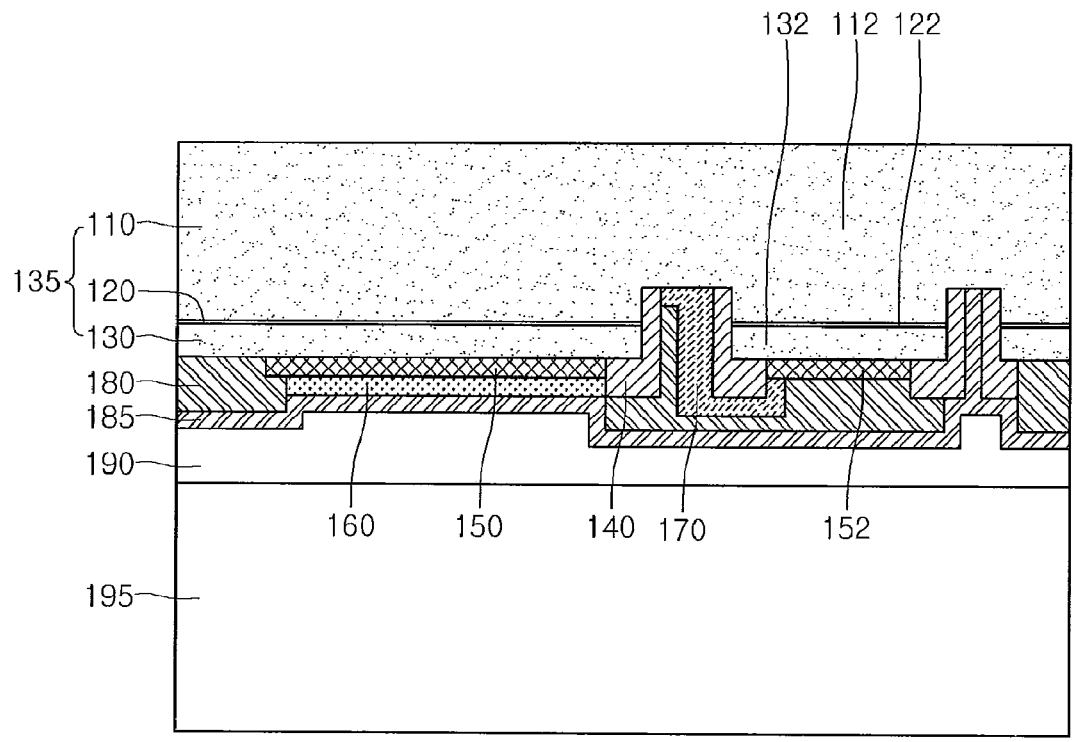

Referring to FIG. 11, the growth substrate 105 may be removed after the light emitting device of FIG. 8 turns over by about 180 degrees.

Here, the growth substrate 105 may be removed using at least one of a laser lift off process and an etching process.

The growth substrate 105 may be removed to expose a surface of the first conductive type semiconductor layer 110.

Figure 12:
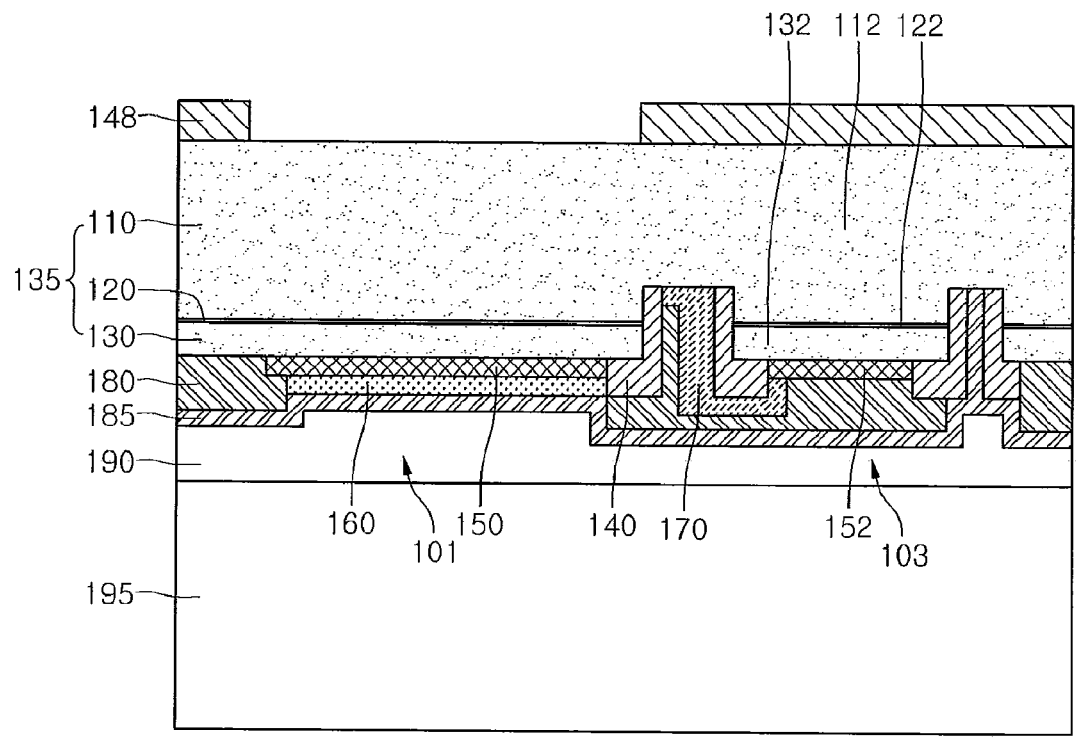

Referring to FIG. 12, a first mask 148 may be formed on a portion of the exposed first conductive type semiconductor layer 110.

For example, the first mask 148 may be formed of one of a photo resist or a metal material, but is not limited thereto.

Figure 13:
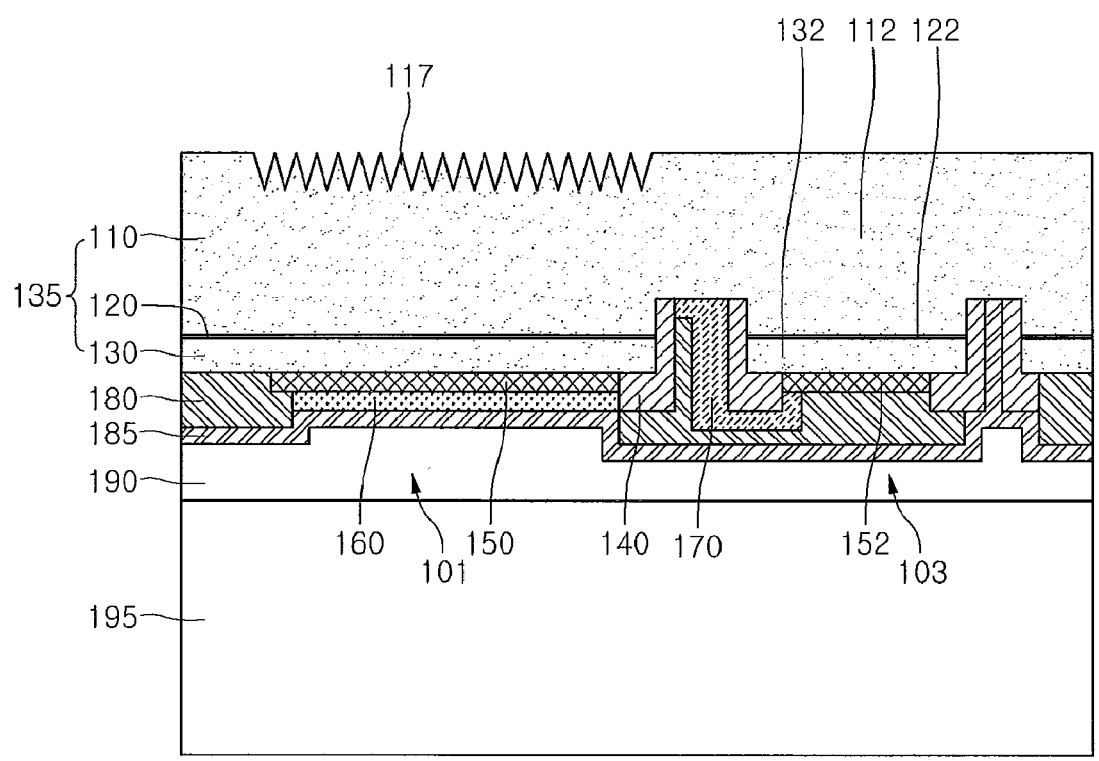

Referring to FIG. 13, a light extraction pattern 117 is formed on a top surface of the first conductive type semiconductor layer 110. Here, the light extraction pattern 117 may be formed on the top surface of the first conductive type semiconductor layer 110 of the light emitting part 101 except a region of the top surface of the first conductive type semiconductor layer 110 covered by the first mask 148.

The light extraction pattern 117 may have a random shape and arrangement or a desired shape and arrangement.

A wet etching process may be performed on the top surface of the light emitting structure layer 135 or a physical process such as a polishing process may be performed to form the light extraction pattern 117 having the random shape.

A pattern mask including a pattern having a shape corresponding to that of the light extraction pattern 117 may be formed on the top surface of the first conductive type semiconductor layer 110 to perform an etching process along the pattern mask, thereby forming the light extraction pattern 117 having the desired shape and arrangement.

After the light extraction pattern 117 is formed, the first mask 148 may be removed.

Figure 14:
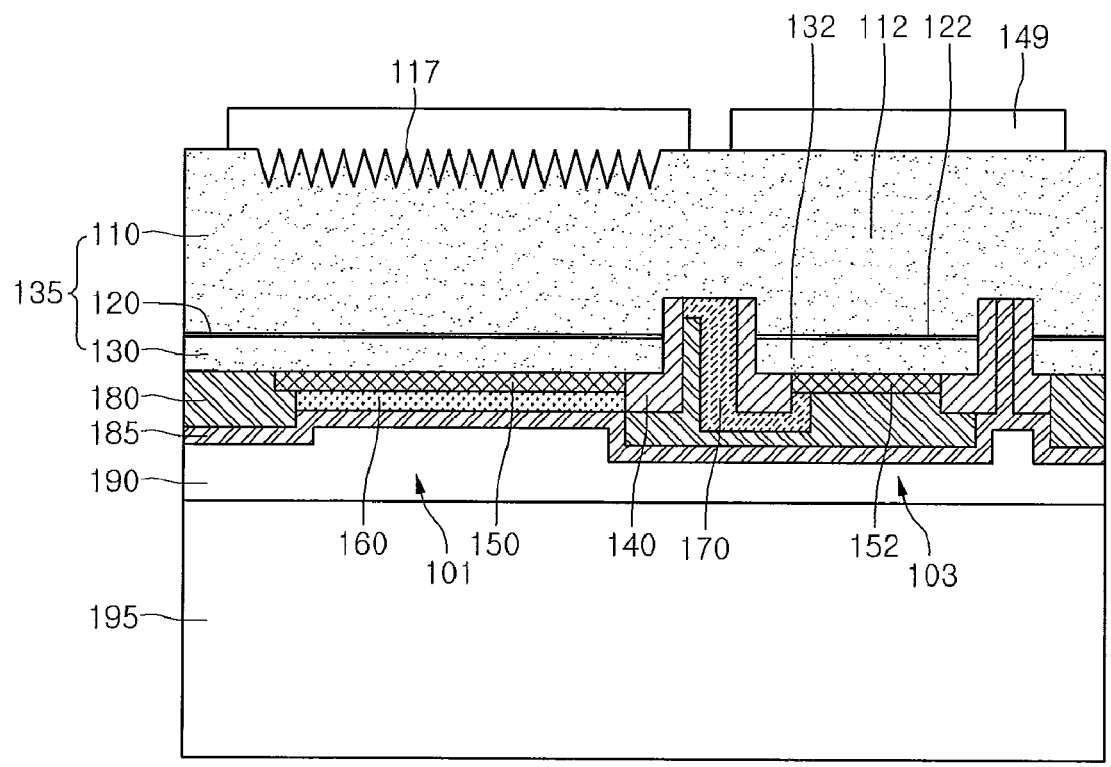

Referring to FIG. 14, a second mask 149 may be formed on the light extraction pattern 117 and the first conductive type semiconductor layer 112 of the ESD protection part 103. The second mask 149 may be formed to perform an isolation etching process for separating the first conductive type semiconductor layer 110 of the light emitting part 101 from the first conductive type semiconductor layer 112 of the first conductive type semiconductor layer 112 of the ESD protection part 103 as well as for dividing a plurality of light emitting devices into device units.

For example, the second mask 149 may be formed of one of a photo resist or a metal material, but is not limited thereto.

Figure 15:
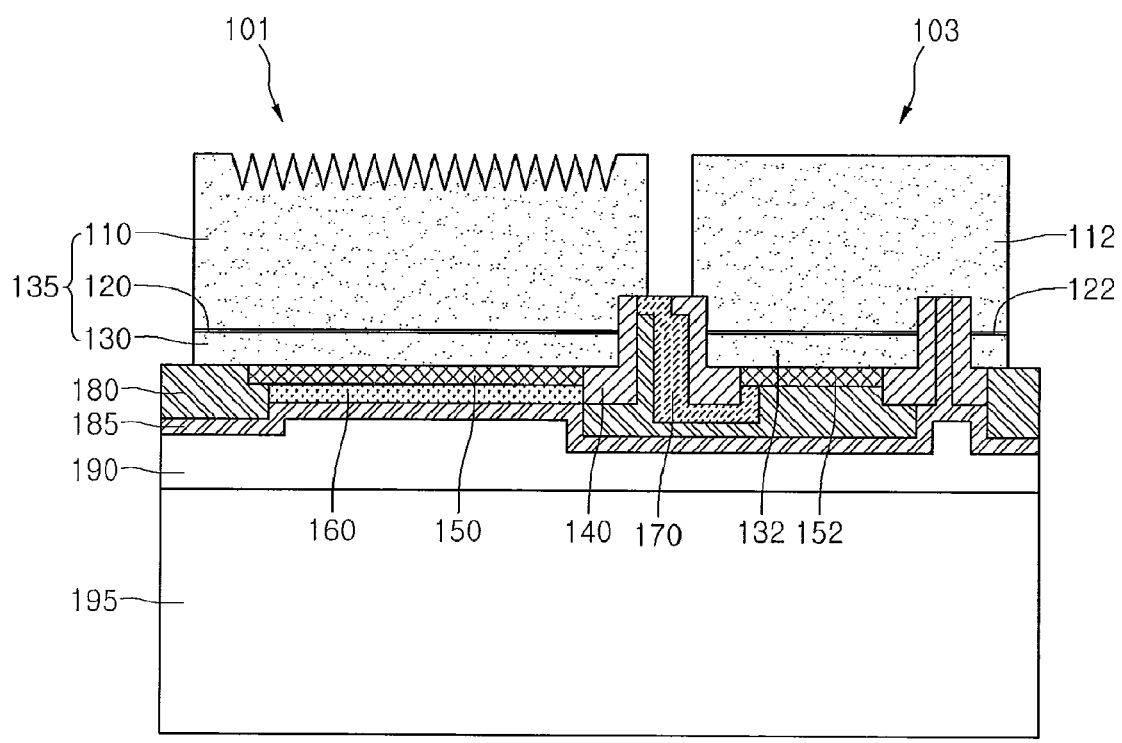

Referring to FIG. 15, the isolation etching process may be performed in a chip boundary region 105 of the light emitting structure layer 135 using the second mask 149 to separate the first conductive type semiconductor layer 110 of the light emitting part 101 from the first conductive type semiconductor layer 112 of the first conductive type semiconductor layer 112 of the ESD protection part 103 and divide a plurality of light emitting devices into device units.

For example, the isolation etching process may be performed through a dry etching process such as an inductively coupled plasma (ICP) process or a wet etching using an etchant such as KOH, $H_2SO_4$, $H_3PO_4$, but is not limited thereto.

Figure 16:
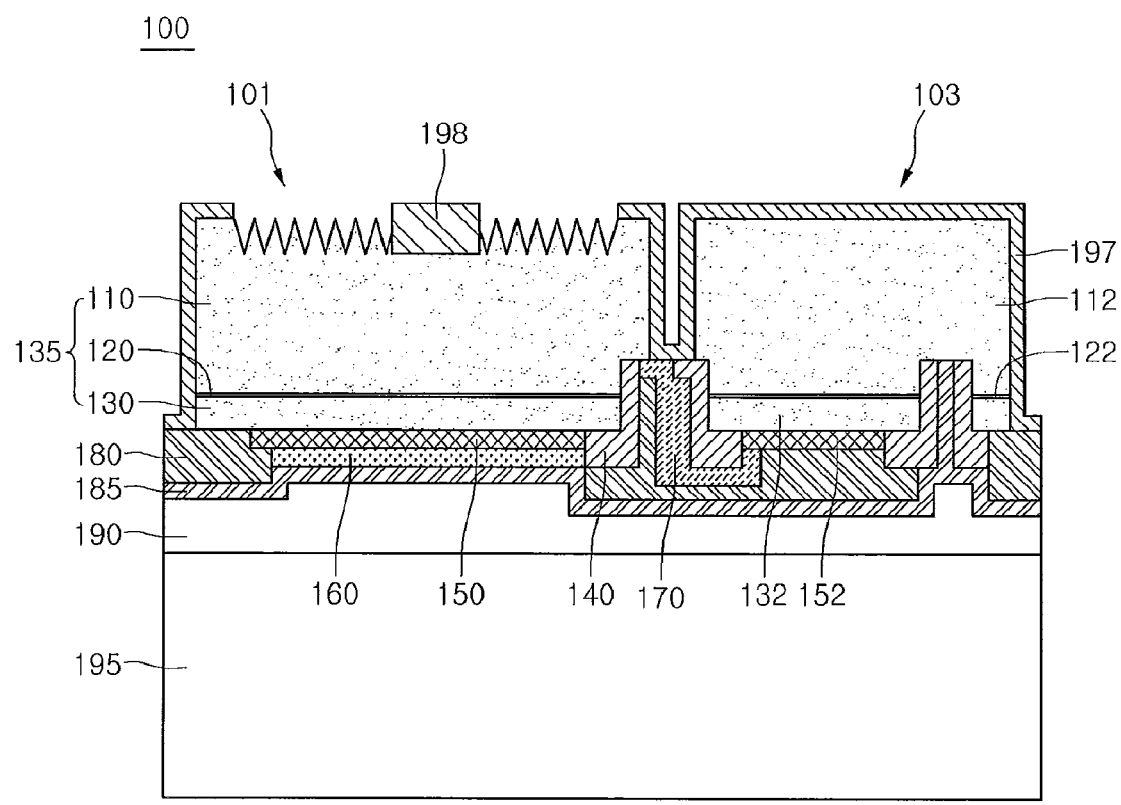

Referring to FIG. 16, a second protection layer 197 may be formed on a top surface of the light emitting structure layer 135 and inner and outer surfaces of the light emitting structure layer 135 etched by the isolation etching process. The second protection layer 197 may prevent the light emitting structure layer 135 from being electrically short-circuited with an external electrode. Also, the second protection layer 197 may prevent the first conductive type semiconductor layer 110 of the light emitting part 101 from being electrically short-circuited with the first conductive type semiconductor layer 112 of the ESD protection part 103. For example, the second protection layer 197 may be formed of an insulating and light-transmitting material, e.g., at least one of $SiO_2$, $SiO_x$, $SiO_xN_y$, $Si_3N_4$, and $Al_2O_3$.

Next, an electrode 198 may be formed on the first conductive type semiconductor layer 110 of the light emitting part 101. The electrode 198 may supply a current into the first conductive type semiconductor layer 110. The electrode 198 may be formed as a single or multi layer using at least one material selected from the group consisting of Ti, Al, In, Ta, Pd, Co, Ni, Si, Ge, Ag, Au, Hf, Pt, Ru, and Au.

As shown in FIG. 16, the light emitting part 101 is formed in one region of the vertical type light emitting device 100, and the ESD protection part 103 is formed in the other region of the vertical type light emitting device 100. Since the crystalline is relatively superior in a region of the first conductive type semiconductor layer 110 of the light emitting part 101 by the first connection layer 170, the Ga-face region having more thermal stability may be electrically connected to the second conductive type semiconductor layer 132 of the ESD protection part 103 and also the second conducive type semiconductor layer 130 of the light emitting part 103 may be electrically connected to the first conductive type semiconductor layer 112 of the ESD protection part 103. Thus, since the ESD passes through the ESD protection part 103, the light emitting part 101 may be protected to improve the reliability of the light emitting device 100.

Figure 17:
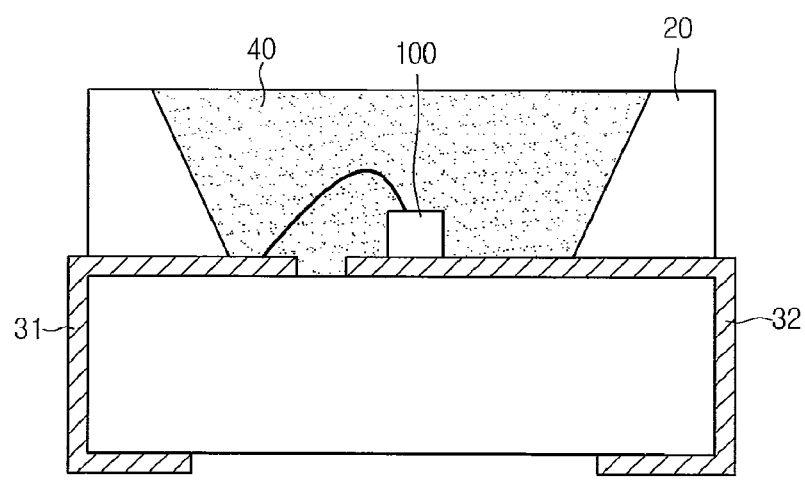
FIG. 17 is a sectional view of a light emitting device package including the light emitting device according to an embodiment.

FIG. 17 is a sectional view of a light emitting device package including the light emitting device according to an embodiment.

Referring to FIG. 17, a light emitting device package according to an embodiment includes a package body 20, first and second electrode layers 31 and 32 disposed on the package body 20, a light emitting device 100 disposed on the package body 20 and electrically connected to the first and second electrode layers 31 and 32, and a molding member 40 surrounding the light emitting device 100.

The package body 20 may be formed of a silicon material, a synthetic region material, or a metal material. Also, the package body 20 may have a cavity in which a side surface thereof is inclined.

The first electrode layer 31 and the second electrode layer 32 are electrically separated from each other and supply a power to the light emitting device 100. Also, the first electrode layer 31 and the second electrode layer 32 may reflect light generated in the light emitting device 100 to improve light efficiency and may release heat generated in the light emitting device 100 to the outside.

The light emitting device 100 may be disposed on the package body 20 or on the first or second electrode layer 31 or 32.

The light emitting device 100 may be electrically connected to the first and second electrode layers 31 and 32 through one of a wiring process, a flip-chip process, and a die bonding process. According to the current embodiment, the light emitting device 100 may be electrically connected to the first conductive layer 31 through a wire 50 and may directly contact the second conductive layer 32 and be electrically connected to the second conductive layer 32.

The molding member 40 may surround the light emitting device 100 to protect the light emitting device 100. The molding member 40 may include a phosphor to change a wavelength of light emitted form the light emitting device 100.

The light emitting device package may be provided in plurality on a board, and optical members such as a light guide plate, a prism sheet, a diffusion sheet, and a fluorescent sheet may be disposed in a path of light emitted from the light emitting device package. The light emitting device package, the board, and the optical member may function as a backlight unit or a lighting unit. For example, a lighting system may include backlight units, lighting units, indicating devices, lamps, and street lamps.

Figure 18:
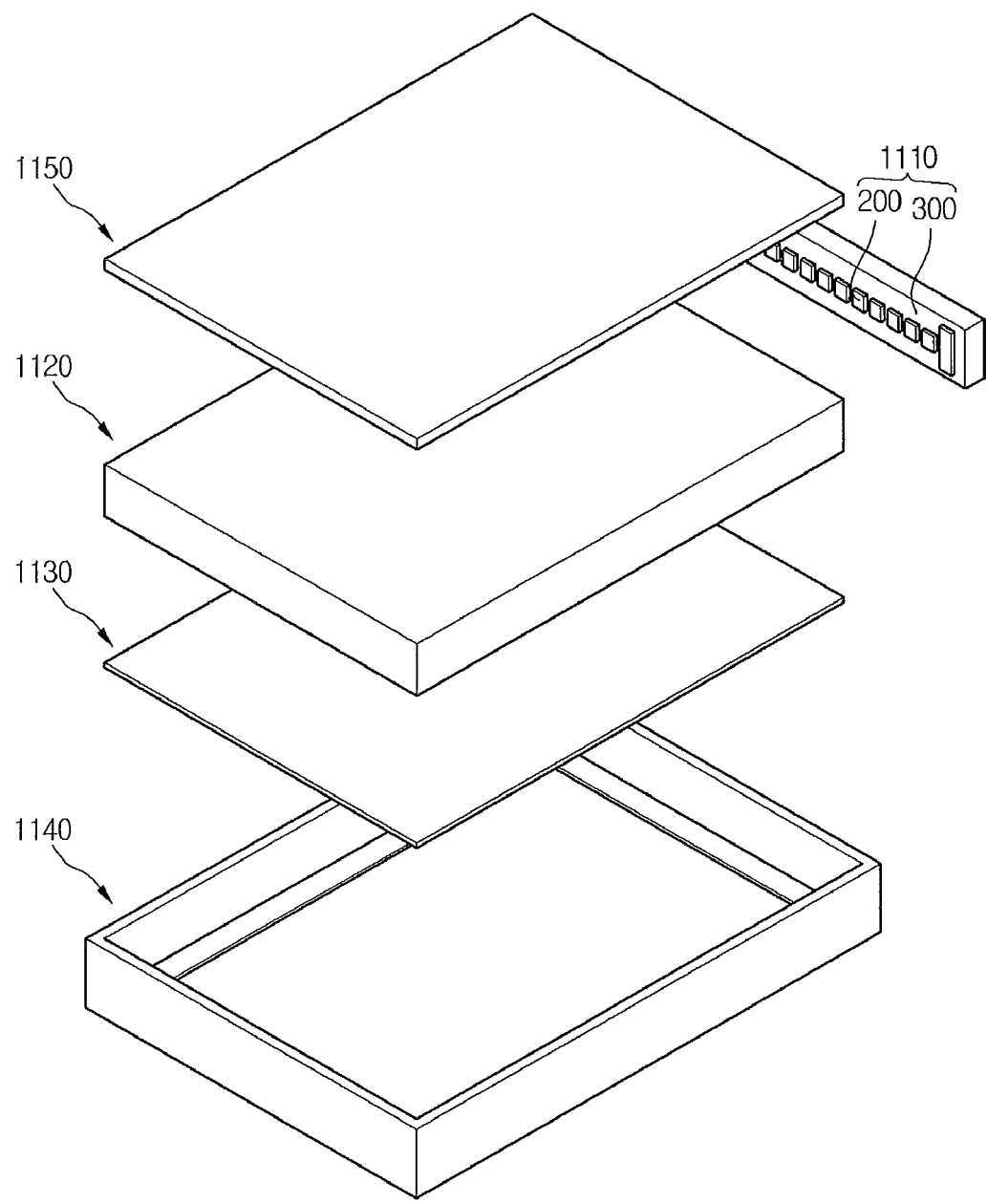
FIG. 18 is a view of a backlight unit including the light emitting device or the light emitting device package according to the embodiment.

FIG. 18 is a view of a backlight unit including the light emitting device or the light emitting device package according to the embodiment. However, a backlight unit 1100 of FIG. 18 is described as an example of the lighting system. Thus, the present disclosure is not limited thereto.

Referring to FIG. 18, the backlight unit 1100 may include a bottom frame 1140, a light guide member 1120 disposed within the bottom frame 1140, and a light emitting module 1110 disposed on at least one side or an under surface of the light guide member 1120. Also, a reflective sheet 1130 may be disposed under the light guide member 1120.

The bottom frame 1140 may have a box shape with an opened upper side to receive the light guide member 1120, the light emitting module 1110, and the reflective sheet 1130. The bottom frame 1140 may be formed of a metal material or a resin material, but is not limited thereto.

The light emitting module 1110 may include a board 300 and a plurality of light emitting device packages 200 mounted on the board 300. The plurality of light emitting device packages 200 may provide light to the light guide member 1120.

As shown in FIG. 18, the light emitting module 1110 may be disposed on at least one of inner surfaces of the bottom frame 1140. Thus, the light emitting module 1110 may provide light toward at least one side surface of the light guide member 1120.

However, the light emitting module 1110 may be disposed under the bottom frame 1140 to provide light toward the under surface of the light guide member 1120. Since this structure is variously varied according to a design of the backlight unit 1100, the present disclosure is not limited thereto.

The light guide member 1120 may be disposed within the bottom frame 1140. The light guide member 1120 may receive the light provided from the light emitting module 1110 to produce planar light, thereby guiding the planar light to a display panel (not shown).

For example, the light guide member 1120 may be a light guide panel (LGP). The LGP may be formed of one of a resin-based material such as polymethyl methacrylate (PMMA), a polyethylene terephthalate (PET) resin, a poly carbonate (PC) resin, a cyclic olefin copolymer (COC) resin, and a polyethylene naphthalate (PEN) resin.

An optical sheet 1150 may be disposed above the light guide member 1120.

For example, the optical sheet 1150 may include at least one of a diffusion sheet, a light collection sheet, a brightness enhancement sheet, and a fluorescence sheet. For example, the diffusion sheet, the light collection sheet, the brightness enhancement sheet, and the fluorescence sheet may be stacked to form the optical sheet 1150. In this case, the diffusion sheet 1150 may uniformly diffuse light emitted from the light emitting module 1110, and the diffused light may be collected into the display panel (not shown) by the light collection sheet. Here, the light emitted from the light collection sheet is randomly polarized light. The bright enhancement sheet may enhance a degree of polarization of the light emitted from the light collection sheet. For example, the light collection sheet may be a horizontal and/or vertical prism sheet. Also, the bright enhancement sheet may be a dual brightness enhancement film. Also, the fluorescence sheet may be a light transmitting plate or film including a phosphor.

The reflective sheet 1130 may be disposed under the light guide member 1120. The reflective sheet 1130 reflects the light emitted through the bottom surface of the light guide member 1120 toward a light emission surface of the light guide member 1120.

The reflective sheet 1130 may be formed of a material having superior reflectance, e.g., a PET resin, a PC resin, or a PVC resin, but is not limited thereto.

Figure 19:
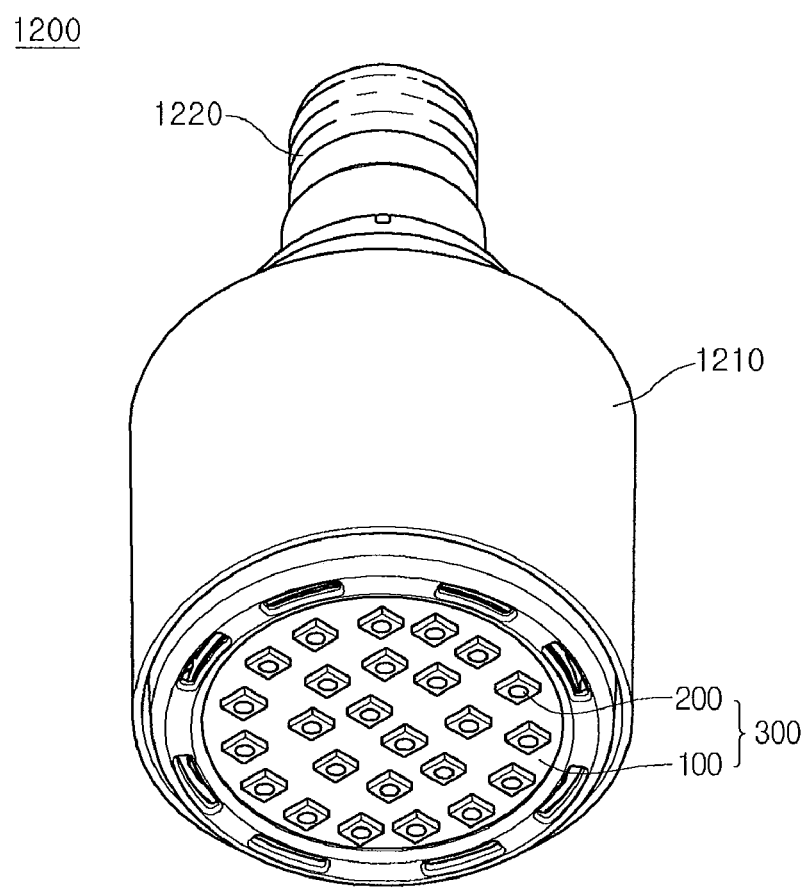
FIG. 19 is a perspective view of a lighting unit including the light emitting device or the light emitting device package according to an embodiment.

FIG. 19 is a perspective view of a lighting unit including the light emitting device or the light emitting device package according to the embodiments. However, a lighting unit 1200 of FIG. 19 is described as an example of the lighting system. Thus, the present disclosure is not limited thereto.

Referring to FIG. 19, the lighting unit 1200 may include a case body 1210, a light emitting module 1230 disposed on the case body 1210, and a connection terminal 1220 disposed on the case body 1210 to receive a power from an external power source.

The case body 1210 may be formed of a material having good thermal dissipation properties, e.g., a metal material or a resin material.

The light emitting module 1230 may include a board 300 and at least one light emitting device package 200 mounted on the board 300.

A circuit pattern may be printed on a dielectric to manufacture the board 300. For example, the board 300 may include a printed circuit board (PCB), a metal core PCB, a flexible PCB, and a ceramic PCB.

Also, the board 300 may be formed of a material which may effectively reflect light or have a color by which light is effectively reflected, e.g., a white color or a silver color.

The at least one light emitting device package 200 may be mounted on the board 300. The light emitting device package 200 may include at least one light emitting diode (LED). The LED may include colored LEDs, which respectively emit light having a red color, a green color, a blue color, and a white color and an ultraviolet (UV) LED emitting UV rays.

The light emitting module 1230 may have various combinations of the LEDs to obtain color impression and brightness. For example, the white LED, the red LED, and the green LED may be combined with each other to secure a high color rendering index. Also, a fluorescence sheet may be further disposed on a path of light emitted from the light emitting module 1230. The fluorescence sheet may change a wavelength of light emitted from the light emitting module 1230. For example, when the light emitted from the light emitting module 1230 has a blue wavelength band, the fluorescence sheet may include a yellow phosphor. Thus, the light emitted from the light emitting module 1230 passes through the fluorescence sheet to finally emit white light.

The connection terminal 1220 may be electrically connected to the light emitting module 1230 to provide a power to the light emitting module 1230. Referring to FIG. 17, the connected terminal 1220 is screw-coupled to an external power source in a socket manner, but is not limited thereto. For example, the connection terminal 1220 may have a pin shape, and thus, be inserted into the external power source. Alternatively, the connection terminal 1220 may be connected to the external power source by a wire.

As described above, in the lighting system, at least one of the light guide member, the diffusion sheet, the light collection sheet, the brightness enhancement sheet, and the fluorescence sheet may be disposed on the path of the light emitted from the light emitting module to obtain desired optical effects.

As described above, the lighting system according to the embodiments includes the light emitting device or the light emitting device package according to the embodiment to improve the light efficiency.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A light emitting device comprising:
a conductive support member;
a light emitting part comprising:
   a first conductive type semiconductor layer;
   an active layer; and
   a second conductive type semiconductor layer on the conductive support member,
   wherein the second conductive type semiconductor layer of the light emitting part is electrically connected to the conductive support member;
an electro-static discharge (ESD) protection part comprising:
   a first conductive type semiconductor layer;
   an active layer; and
   a second conductive type semiconductor layer on the conductive support member,
   wherein the first conductive type semiconductor layer of the ESD protection part is electrically connected to the conductive support member;
a first connection layer electrically connecting the first conductive type semiconductor layer of the light emitting part to the second conductive type semiconductor layer of the ESD protection part, and physically contacting a Ga-face region of a bottom surface of the first conductive type semiconductor layer of the light emitting part; and
a protection member on the ESD protection part and the first connection layer,
wherein the protection member physically contacts a bottom surface of the first connection layer.

2. The light emitting device according to claim 1, further comprising:
a first ohmic contact layer between the second conductive type semiconductor layer of the light emitting part and the conductive support member; and
a second ohmic contact layer between the second conductive type semiconductor layer of the ESD protection part and the protection member.

3. The light emitting device according to claim 2, further comprising a second connection layer electrically connecting the second conductive type semiconductor layer of the light emitting part through the protection member to the first conductive type semiconductor layer of the ESD protection part.

4. The light emitting device according to claim 3, further comprising a second protection layer on an outer surface of the light emitting part and an outer surface of the ESD protection part.

5. The light emitting device according to claim 3, further comprising a reflective layer between the second connection layer and the first ohmic contact layer.

6. The light emitting device according to claim 4, further comprising a first protection layer surrounding each of the first and second connection layers.

7. The light emitting device according to claim 3, wherein the second connection layer is disposed on the light emitting part and the ESD protection part.

8. The light emitting device according to claim 3, wherein the second connection layer comprises a first end contacting the first ohmic contact layer and a second end contacting the first conductive type semiconductor layer of the ESD protection part.

9. The light emitting device according to claim 3, wherein the second connection layer covers an entire area of the protection member.

10. The light emitting device according to claim 6, wherein the first protection layer is disposed between the first connection layer and the active layer of the light emitting part or between the second connection layer and the active layer of the ESD protection part.

11. The light emitting device according to claim 4, wherein the second protection layer contacts the first connection layer.

12. The light emitting device according to claim 6, wherein the first protection layer contacts the second protection layer.

13. The light emitting device according to claim 5, wherein the reflective layer contacts the first ohmic contact layer.

14. The light emitting device according to claim 5, wherein the reflective layer comprises a light-transmitting conductive material.

15. The light emitting device according to claim 1, wherein the first connection layer is disposed at a boundary between the light emitting part and the ESD protection part.

16. A light emitting device comprising:
a conductive support member;
a light emitting part comprising a first structure layer;
an electro-static discharge (ESD) protection part comprising a second structure layer, wherein the first and second structure layers each comprise:
   a second conductive type semiconductor layer on the conductive support member;
   an active layer on the second conductive type semiconductor layer; and
   a first conductive type semiconductor layer on the active layer;
a first recess extending through the second conductive type semiconductor layer and the active layer of the light emitting part;
a first protection layer around a side surface of the first recess;
a second protection layer around a side surface of the second recess;

a second recess extending through the second conductive type semiconductor layer and the active layer of the ESD protection part;

a first connection layer connecting a Ga-face region of the first conductive type semiconductor layer of the light emitting part to the second conductive type semiconductor layer of the ESD protection part through the first protection layer, and physically contacting the Ga-face region of a bottom surface of the first conductive type semiconductor layer of the light emitting part; and a protection member on the first connection layer and the second conductive type semiconductor layer of the ESD protection part, wherein the protection member physically contacts a bottom surface of the first connection layer.

17. The light emitting device according to claim 16, further comprising:

a second connection layer connecting the second conductive type semiconductor layer of the light emitting part to the first conductive type semiconductor layer of the ESD protection part through the second protection layer;

a first ohmic contact layer between the second conductive type semiconductor layer of the light emitting part and the conductive support member; and a second ohmic contact layer between the second conductive type semiconductor layer of the ESD protection part and the protection member.

18. The light emitting device according to claim 17, further comprising an adhesion layer between the second connection layer and the conductive support member.

19. The light emitting device according to claim 17, further comprising a reflective layer between the second connection layer and the first ohmic contact layer.

20. A light emitting device package comprising:
a body;
a light emitting device on the body; and
a molding member surrounding the light emitting device, wherein the light emitting device comprises:
a conductive support member;
a light emitting part comprising:
a first conductive type semiconductor layer;
an active layer; and
a second conductive type semiconductor layer on the conductive support member,
wherein the second conductive type semiconductor layer of the light emitting part is electrically connected to the conductive support member;
an electro-static discharge (ESD) protection part comprising:
a first conductive type semiconductor layer;
an active layer; and
a second conductive type semiconductor layer on the conductive support member,
wherein the first conductive type semiconductor layer of the ESD protection part is electrically connected to the conductive support member;
a first connection layer electrically connecting the first conductive type semiconductor layer of the light emitting part to the second conductive type semiconductor layer of the ESD protection part, and physically contacting a Ga-face region of a bottom surface of the first conductive type semiconductor layer of the light emitting part;
a second connection layer electrically connecting the second conductive type semiconductor layer of the light emitting part to the first conductive type semiconductor layer of the ESD protection part; and
a protection member on the ESD protection part and the first connection layer,
wherein the protection member physically contacts a bottom surface of the first connection layer.

* * * * *